United States Patent [19]

Stelter

[11] 4,004,045
[45] Jan. 18, 1977

[54] METHOD FOR FLUID FILM APPLICATION

[76] Inventor: Manfred K. Stelter, 1450 Sunnyside, Highland Park, Ill. 60035

[22] Filed: Aug. 9, 1974

[21] Appl. No.: 496,070

[52] U.S. Cl. .............................. 427/55; 427/314; 427/345; 427/420; 427/430 R
[51] Int. Cl.² ........................ B05D 3/06; B05D 3/10
[58] Field of Search .......... 427/430, 420, 299, 314, 427/55, 345; 118/410, 411; 134/10, 15, 34

[56] References Cited

UNITED STATES PATENTS

| | | | |
|---|---|---|---|
| 1,926,363 | 9/1933 | Bergstein | 134/15 |
| 2,681,294 | 6/1954 | Beguin | 96/85 |
| 3,218,193 | 11/1965 | Isaacson | 427/345 |
| 3,369,918 | 2/1968 | Young | 427/345 |
| 3,533,833 | 10/1970 | Takahashi et al. | 427/345 |
| 3,705,457 | 12/1972 | Tardoskegyi | 427/345 |

OTHER PUBLICATIONS

Fisler, T893001 Def. Pub., Dec., 1971.

Primary Examiner—John H. Newsome
Attorney, Agent, or Firm—Lockwood, Dewey, Zickert & Alex

[57] ABSTRACT

Apparatus and method for depositing a uniformly micro-thin layer of fluid on the face of a panel or substrate by moving the panel face down in oppositely moving contiguously juxtaposed position with a thin sheet of said fluid substantially laminarly flowing across a horizontal weir. The weir is so arranged as to form an acute angle between direction of fluid travel and the plane of movement of the piece to be coated. Once the panel touches the surface of the moving sheet of fluid, the surface tension between the fluid and panel causes a uniform micro-thin layer of the fluid to be deposited on the panel. If the method is used for lacquer or resist application, the layer of fluid is then baked onto the panel until it is dried into a solid. If the method is used for developing or rinsing photo plates or semi-conductor wafers, a slightly turbulent flow across the weir is desirable and the excess liquid remaining on the substrates may be blown off by a stream of high velocity gases.

8 Claims, 7 Drawing Figures

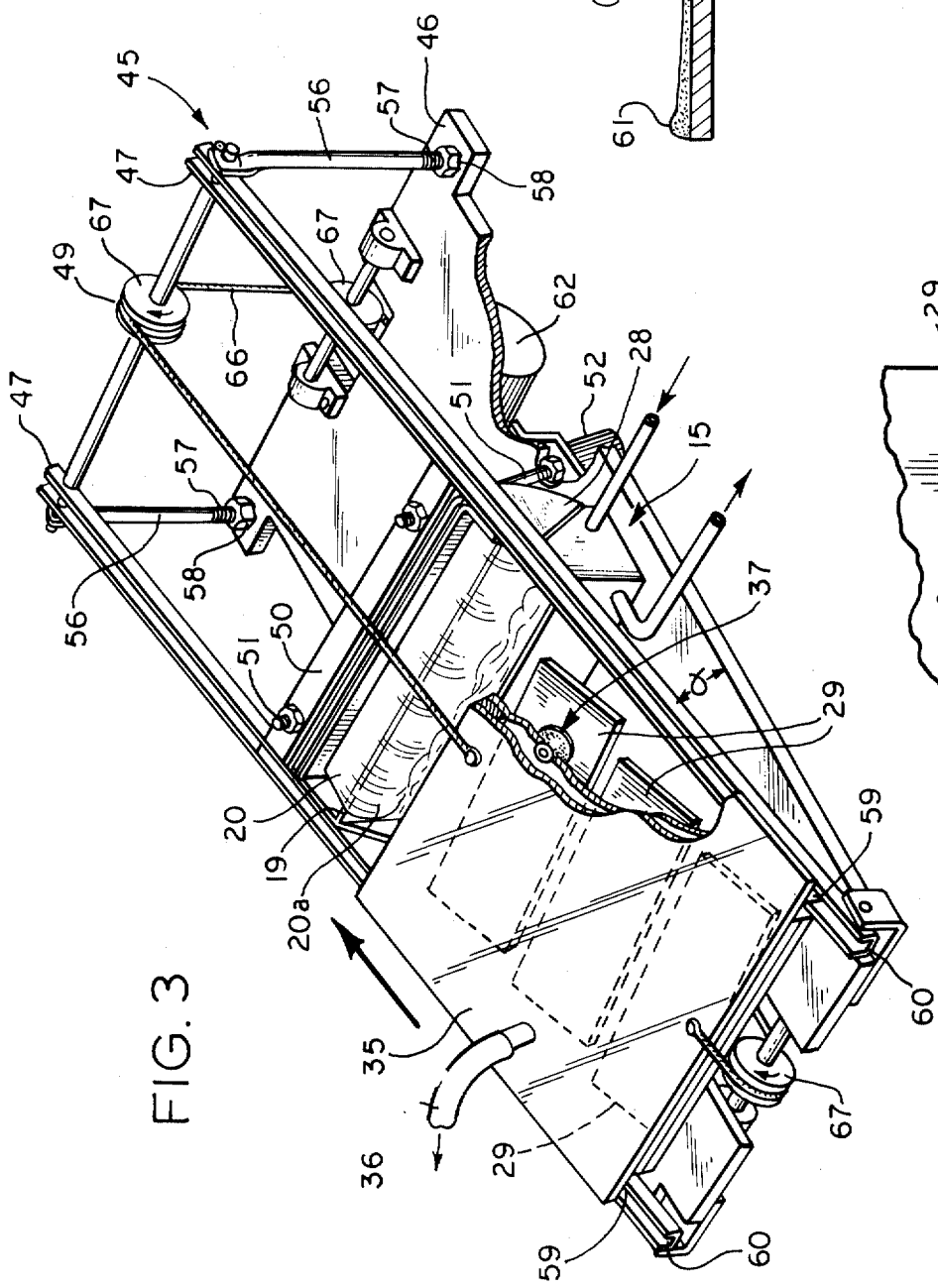
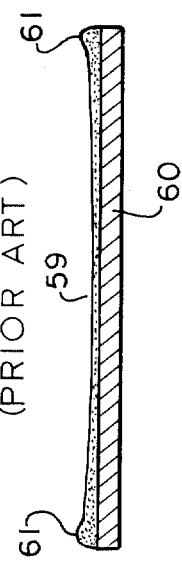
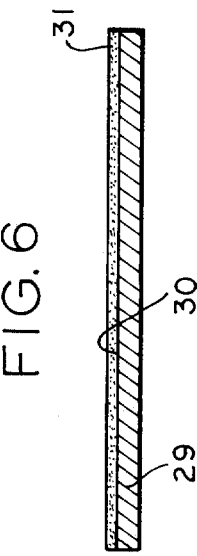
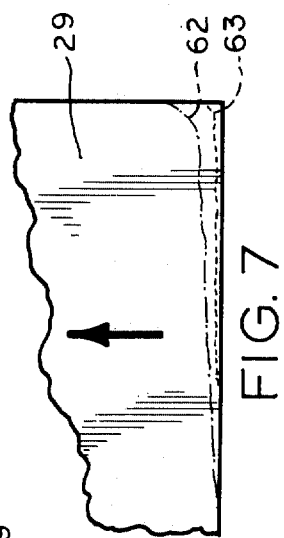

METHOD FOR FLUID FILM APPLICATION

This invention relates to a method and apparatus for depositing a layer of a liquid substance onto a panel. More particularly, the invention relates to deposition of a photoresist lacquer or dopant onto a surface of suitable substrates including glass, metal, plastic, or the like which may be flat or a curved planed surface. It should be noted that clean room techniques are utilized with the method and apparatus of the invention to prevent contamination of either the coating or substrate surface. Coated substrates of the type produced by the invention disclosed hereafter may be utilized in (1) electronics to affect the semi-conductor properties of silicon, germanium, and the like; (2) in liquid crystal display; (3) for lens coating; and (4) photo plate developing; among other uses.

Presently, several methods of layer deposition onto substrates, and apparatus to implement those methods, exist. The most common method of depositing a micro-thin layer of photoresist lacquer onto a substrate plate comprises mounting the substrate plate face up on a turntable, rotating the turntable at a high speed, i.e., in the neighborhood of 10,000 RPM, and dropping minute amounts of photoresist lacquer or dopant onto the center of rotation of the substrate face to be coated. The combination of centrifugal force and surface tension between the liquid and the substrate causes the drop of photoresist lacquer to spread outwardly on the substrate surface. One shortcoming of this method of applying a photoresist lacquer or dopant to the substrate involves an increase in surface tension adjacent the edges of the substrate. Since the surface tension between the lacquer and substrate is greater at the edge of the substrate than along the surface, the liquid builds up along the edge of the substrate during rotation causing the layer to be thicker there than in the middle of the plate. The difference between the thickness of the layer at the edge and at the interior may be on the order of 4 to 1, i.e., the layer thickness in the center of the substrate may be on the magnitude of 6,000 angstroms and the layer at the edge of the substrate may be 25,000 angstroms. A second shortcoming of this method of applying photoresist lacquer or dopant onto substrates is the wastage of excess liquid which is thrown from the edges of the substrate after building up there as previously mentioned. This excess photoresist lacquer cannot as a practical matter be accumulated and reused. Third, as long as the surface of the substrate which is to be coated is facing upward, the possibility of contamination of that surface or of the layer of coating placed thereon by foreign particles landing on the surface or coating is greatly increased.

Another method of applying a layer of coating to a flat plate is utilized in depositing a layer of solder onto an integrated circuit board. In this method, a bath of molten solder is employed and a stream of the molten solder is forced upward from the bath creating an elevated turbulent wave across the bath. The integrated circuit board is then passed over the wave in contact with the same, thereby depositing a layer of solder on the undersurface of the board contacting the wave. The shortcomings of this method include the instability of the turbulent wave which is necessary to maintain the elevated position of the liquid solder from the bath and which causes the coating to vary in thickness across the integrated circuit board. Also, the coating of solder deposited on the board is much thicker than the coating utilized in a photoresist or dopant layer deposited on a substrate.

The apparatus and method of the present invention eliminates the shortcomings heretofore present in prior methods of depositing a micro-thin layer of dopant or photo-resist onto a substrate in that it deposits a uniformly micro-thin layer of dopant or photoresist lacquer onto the substrate, recirculates and reuses any of the liquid not applied to the substrate, and deposits the coating onto the substrate in a manner preventing the contamination of either material, liquid or substrate, by foreign particles falling onto the substrate before coating or falling onto the coating before drying of same on the substrate. The invention overcomes the shortcomings of the prior art by coating the substrate as it is passed face down, across the contiguous with the outer surface of a thin sheet of the coating liquid which has a laminar flow over a weir in a direction substantially opposite that of the movement of the substrate. The surface tension between the substrate and the thin sheet of coating fluid causes the micro-thin layer to be deposited on the substrate.

The apparatus and method of the invention include a dual chamber weir structure having a common wall between chambers, the top edge of the common wall having a horizontal straight edge defining a weir over which the coating liquid flows. The straight edge can be a knife edge or have appreciable width. A substrate mounting and guide means set at an incline from the horizontal is positioned adjacent to the edge defining the weir and the substrate plates are attached to the bottom of the mounting means and then guided in a precise manner and path across the weir means in a direction substantially opposite that of the sheet of fluid flowing across the weir. The leading edge of the substrate contacts the surface of the fluid sheet and the surface tension there-between deposits a layer of the fluid on the surface of the substrate as the substrate is passed over the weir. After the substrate is drawn across the weir means and a layer of fluid is deposited thereon, the substrate is maintained in a face-down positon until the fluid dries to form a solid micro-thin layer. The guide means of the apparatus may differ depending on the number of substrates to be coated within a given time span. Straight guide rails and a substrate mounting plate positioned thereon and guided thereby may be utilized in conjunction with the coating weir means to coat substrates by the batch, or an endless conveyor belt guide means may be utilized in conjunction with the coating weir means for continuous coating of substrates. Additionally, means for cleaning the substrate surfaces prior to coating them and means for drying the coating once it is placed on the substrate surface may be located adjacent the guide means producing a complete substrate coating apparatus.

It is therefore an object of this invention to provide an improved method and apparatus for depositing a uniformly micro-thin coating onto the face of a panel.

Another object of the invention is to provide a weir coating means for producing a thin sheet of liquid photoresist lacquer or dopant which can be deposited onto the surface of a substrate by passing the substrate in close proximity to the critical edge of said weir coating means.

A further object of the invention is to provide apparatus and methods for producing, in batches or continuously, micro-thin coated substrates by maintaining the substrates in a face-down position, scrubbing the surface to be coated with a cleaning agent, rinsing the cleaning agent from the surface, drying the surface, applying a coating to the surface, and drying the coated surface on the substrate at least to a point where it may be placed face upward without the danger of particles in the surrounding atmosphere contaminating the coating.

Other objects, features, and advantages of the invention will be apparent from the following detailed disclosure taken in conjunction with the accompanying drawings, wherein like reference numerals refer to like parts, in which:

FIG. 3 is a top perspective view of a dual chamber weir coating means embodying the invention, in combination with substrate guide means in the form of guide rails and a mounting plate slidable thereon capable of producing micro-thin coated substrates in batches;

Figures 1, 2, 4:
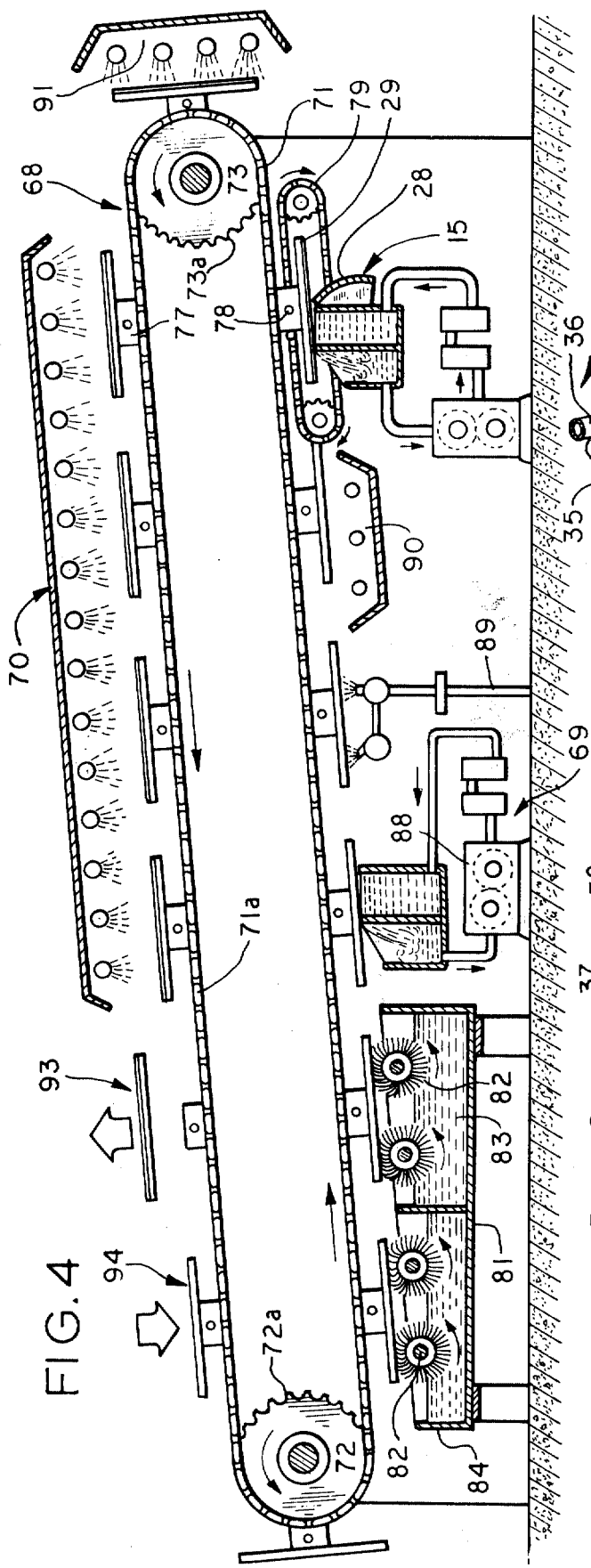
FIG. 1 is a perspective view of a dual chamber weir coating means forming one embodiment of the invention and showing a substrate being passed across the wier means such that a coating is being applied to the face-down surface of the substrate.
FIG. 2 is a fragmentary cross-sectional view taken along line 2—2 of FIG. 1.

FIG. 4 is a schematic side elevation of a dual chamber weir coating means in combination with guide means including an endless conveyor belt and means for scrubbing the surface of the substrates with a cleaning solution, rinsing the cleaning solution from the surface, and drying the cleaned and scrubbed surface before applying the coating thereon, all while the substrate is in a face-down position, and means for drying said coating on said substrate after the coating is applied, and providing the capability of producing coated substrates in a continuous manner;

FIG. 5 is a cross sectional view of a typical substrate plate including a micro-thin photoresist coating applied thereto by using prior art methods;

FIG. 6 is a cross-sectional view taken along line 6—6 of FIG. 3 showing the uniform cross-sectional thickness of the coating applied to the substrate by the apparatus and method of the invention; and FIG. 7 is a fragmentary horizontal plan view showing the differences in the shape of the coating trailing edge when the plates are passed across the weir coating means at different trailing angle relations thereto.

Turning to FIG. 1, the weir coating means is shown generally at 15. It includes dual coating-liquid holding chambers, i.e., a larger upper reservoir chamber 16, and a smaller lower receiving chamber 17 which receives coating fluid flowing laminarily out of the larger upper reservoir chamber 16. A common wall or baffle 18 most clearly shown in FIG. 2 separates the two chambers and the top edge 19 of common wall 18 is horizontal, rectilinear, and defines a wier over which a thin sheet of coating fluid 20 flows. Besides the common wall 18, the dual chamber weir means 15 of the present embodiment includes common side walls 18a, 18b, common bottom wall 18c, a high back wall 21 on upper chamber 16 and a low front wall 22 on lower receiving chamber 17. It can be appreciated that the two chambers may be of other construction, such as being completely separate structures placed adjacent one another, without depreciating from the scope of the invention. Coating liquid 20 may more particularly be referred to as a dopant or photoresist lacquer and is introduced into the upstream reservoir through inlet 24. The liquid may be entering upstream chamber 16 in a turbulent condition. However, by the time the reservoir has filled the fluid flow over weir 19 at the top of the reservoir is laminar if the weir is to be used for lacquer or photoresist application. A slightly turbulent flow across the weir is desirable for developing and rinsing photo plates or semi-conductor wafers. The flowing fluid then spills over the lowest side of the reservoir which is the weir edge 19 of common wall 18 in a thin uniform sheet 20a into the downstream receiving chamber 17. The thickness of thin liquid sheet 20a depends on the rate of fluid flow over the weir 19 which in turn is governed by the output of a recirculating pumping means 25 connected to the downstream chamber by outlet 26. From the recirculating pumping means 25, coating fluid 20 is thoroughly filtered by dual in-line micro-fine filters 27 of known commercial type before being recirculated to the upstream chamber inlet 24. Filters 27 are capable of separating particles approximately three one millionths of an inch in diameter from the fluid 20 assuring the deposition of a very pure coating onto the substrate. A cover 28 is pivotally mounted to the side of the weir means at 28a and may be placed in a position which covers the open top of upstream chamber 16 and downstream chamber 17 when the coating apparatus of the invention is not in use preventing comtamination of the chambers by foreign particles and excessive evaporation of solvents. The shape of the top portion of the weir coating means 15 is important insofar as the weir edge 19 and the sheet of fluid 20a flowing over it must present a preeminent position to any substrate 29 passed continuously and tangentially thereacross. Therefore, the top edges of the chamber walls 18aT, 18bT, 21T, and 22T are positioned so they recede from an adjustably acutely angled path P—P of travel which any substrate 29 follows across the coating weir means 15.

In operation, the panel or substrate 29 is moved in a precise and accurate manner across the weir coating means 15 at an inclined angle so that the surface 30 of the substrate to be coated contacts the surface of the thin sheet of coating fluid flowing across the weir tangentially at which time the surface tension between the coating fluid 20 and substrate surface 30 draws a uniformly micro-thin layer 31 of the coating 20 onto the surface 30 of the substrate 29. The thickness of the coating layer 31 depends on the viscosity of the coating fluid, the relative temperatures of the substrate and coating fluids, the rate of flow of the coating fluid over the weir 19, and the speed with which the substrate 29 draws across the coating weir 19. The use of a weir coating means necessitates placing the substrate surface to be coated 30 face down while the coating or layer 31 is applied thereto. Additionally, the face-down coating position protects the surface to be coated from contaminating particles in the enviroment which might land on the surface were it to face upward during coating.

The substrate 29 is moved across the weir 19 in a precise manner. The substrate 29, in this embodiment, is attached to a mounting platform 35 which is connected to guide means, to be described infra. Mounting platform 35 holds the substrate in an inverted position suspended therefrom by vacuum means including a vacuum line 36 which is connected to small rubber vacuum cups, generally shown at 37, having a deformable lip 38, a hollow portion 39, and a port 40 in communication with vacuum line 36. Cups 37 may be made of room temperature cure (RTC) rubber or other suitable material.

In operation, substrate 29 is placed against the lip 38 of vacuum cup 37 and a seal is produced therebetween which tends to retain the cup. The use of a plurality of such vacuum cups 37 will hold the substrate 29 in an inverted suspended position allowing precise movement of the substrate across the weir 19. It can be understood that other methods of mounting and precisely moving the substrate plates from across the weir may be utilized without depreciating from the scope of the invention.

While the substrate could be moved across the weir edge 19 by hand, practically, a guide mechanism for precisely moving the substrates located adjacent the weir coating means 15 should be utilized in order to coat substrates in a consistent efficient manner. In FIGS. 3 and 4, two different guide means embodiments are shown which enable substrates to be coated by the weir coating means of the invention in batches or in a continuous manner, respectively.

In FIG. 3, an adjustable inclined substrate positioning means, shown generally at 45, includes a base platform 46 onto which the entire coating apparatus including the coating weir means 15, adjustably inclined parallel guide rails 47—47, the substrate mounting plate 35 which rides in the guide rails, and a drive means 49. The pair of adjustable inclined guide rails 47—47 are maintained in parallel position by cross-brace 50 connected therebetween and are pivotally mounted to the base platform 46 at the guide rail end which defines the bottom of the incline. Attached to the cross brace 50 are rods 51—51 extendably connected to power incline adjusting means 52 which may include electrical solenoids, hydraulic cylinders, or the like and which are rigidly mounted to the base platform 46. Guide rail support rods 56—56 attached to the higher positioned end of guide rails 47—47 may also be adjustably connected to the base platform 46 by means of threads 57—57 thereon and adjusting nuts 58—58 mounted on the threads along the support rods 56—56.

Once a proper angle of incline for the guide rails 47—47 is found, adjusting nuts 58—58 may be turned down to rigidly mount a support rod 56 to a given positon on the platform 46 to maintain the guide rails at the desired incline angle alpha ($\alpha$). While the inclined angle alpha may be any acute angle, a preferred angle of incline between the horizontal platform 46 and guide rails 47—47 is between 10° and 20°. It can be appreciated as the angle of incline alpha is changed, the position of weir coating means 15 adjacent the guide rails 47—47 may have to be changed to maintain the weir edge 19 in close proximity to the substrate plates 29 as they pass across the weir.

The substrate mounting platform 35 may be of any shape so long as it rides in guide rails 47—47 and has mountings along the bottom thereof for retaining the substrate plate 29 in a precise maner thereon. Substrate mounting platform 35 in this embodiment is substantially flat, hollow, and includes the vacuum mounting cups 37, described previously, for retaining the substrate plate 29 along the bottom of the mounting platform. The mounting platform 35 has detents 59—59 located at the outer ends on the platform which ride in indents 60—60 in the guide rails 47—47 and guide the platform along the guide rails in a precise manner as necessitated to accurately coat the substrates 29 mounted thereon. In practice, a preferred material for the guide rails is aluminum and the preferred material for the indents 59 is polytetra fluoroethylene sold under the trademark "Teflon". The aluminum-teflon combination has a smooth flowing interface therebetween which allows for precise movement of the substrates.

The platform 35 is limited in the number of substrates 29 which can be mounted thereon for processing at any one time. In the embodiment shown, three substrates 29 are mounted on the platform and can be processed in successive order in one batch. Mounting the substrates 29 on mounting platform 48 and moving the platform on guide rails 47 so they are passed across the weir edge 19 in a position so the surface 30 of the substrate 29 is contiguous with the surface of the thin sheet 20a of coating fluid 20 results in the depositon of a uniformly thin layer 31 shown in FIG. 6 on the surface 30 of substrate 29.

This uniformly thin layer 31 is superior to micro-thin layers formed by prior art methods which include dropping the coating fluid onto a spinning substrate which produces a coating similar to that shown at 59 in FIG. 5 on a similar substrate 60. While rotating the substrate 60 and dropping the coaing fluid thereon produces a thin layer in the center of the substrate, the surface tension between the outer edge of the substrate 60 and the fluid 20 produces a build up 61 at each edge of the substrate which may be several times the thickness of the layers in the middle of the substrate. For instance, the coating layer 59 may be 6,000 angstroms thick at the center of the substrate, and 25,000 angstroms thick at position 61 near the edge of the substrate.

When substrates 29 are moved across the weir edge 19 in a position substantially opposite the movement of the sheet of flowing fluid 20a it should be noted that if the substrate is placed exactly perpendicular to the weir edge 19 and exactly opposite the flow of fluid, the trailing edge of each substrate layer 31 breaks contact with the surface of the fluid in a manner which provides a somewhat wavy perimeter of the coating on the substrate 29, especially toward the outside edges of the trailing side which is shown in enlarged form at 62 in FIG. 7. By skewing the substrates 29 on the mounting platform 35 as shown in FIGS. 2 and 3, the substrate surface 30 breaks contact with the surface of the coating fluid 20a along a moving line as the substrate passes over the weir edge 19 rather than breaking contact at one time along a trailing line. Skewing the substrate across the weir edge results in a smoother trailing edge of the coating which is shown at 63 in FIG. 7 and produces a superior coating on the substrate.

A drive means 49 used to move the substrate mounting platform 35 along the guide rails 47 and across the weir coating means 15 is, in this embodiment, a cord and pulley mechanism which is power rotated by a prime mover 62 which may also be utilized for powering the power guide rail incline adjusting means. A cord 66 is attached to one end of the mounting platform 35 and runs across a plurality of rotatable pulleys 67 through the prime mover 62 and thence to the opposite end of the mounting platform where it is again connected thereto. When the prime mover 62 is activated the cord is moved and the connected substrate mounting platform 35 driven across the weir edge 19 in a smooth precise manner. It should be noted that the surface 30 of substrate 29 has already been cleaned prior to mounting on the moving platform 30. Cleaning apparatus may be mounted on the base platform 46 to prepare the surface 30 for coating. Such cleaning apparatus will be described hereinafter in connection with a second guide means embodiment of the invention and it is to be understood that the same or similar apparatus may be used in conjunction with the first guide means embodiment.

In FIG. 4, an endless belt substrate mounting and guide means is shown generally at 68 as a second embodiment in combination with the weir coating means of the invention 15 described previously. Means for cleaning the substrate surface to be coated is included therein and generally shown at 69, and means for drying the coating onto the substrate once it has been placed thereon in liquid form is shown generally at 70. Guide means 68 includes an endless belt 71 which is mounted between pulleys or gear wheels 72, 73, one of which is preferably connected to driving means (not shown) the other being an idler. The drive means controls the rate of rotation of the belt 71 and the teeth of the gears 72a, 73a, match indents 71a in the endless belt providing for positive longitudinal and zero lateral movement of the belt therein.

The substrate mounting and guide means 68 of the invention is shown mounted at an inclined angle, i.e., the center line of gear 72 being positioned lower than the center line of gear 73 as a preferred embodiment. An important feature of the invention is that the substrate 29 mounted in the guide means 68 travel across the weir means 15 at a positive incline angle. It can therefore be appreciated that the entire guide means would not have to be inclined as long as that portion of the guide means immediately adjacent the weir coating means 15 were inclined.

Endless belt 71 also includes substrate mounting means 77 located at intervals along the belt. Substrate mounting means 77, in this embodiment, performs a function similar to that of the mounting platform 35 and vacuum cup 37 of the batch coating apparatus 45. However, the substrate mounting means 77 attached to the endless conveyor belt 71 has an attachment member 78 thereon which is engaged by a secondary drive means 79 which overrides the primary guide means 68 in the immediate area of weir coating means 15 and more precisely guides each substrate 29 thereacross. The secondary drive means may utilize an air bearing, fluidic, or pneumatic principle to assure a smooth path of substrate movement across the weir edge.

Means for cleaning and preparing the substrate surface 30 to be coated are shown generally at 69 in a position beneath and adjacent the endless belt 71 along the lower portion of the belt path reached prior to attaining the vicinity of the coating weir means 15. The cleaning means 69 contains scrubbing means 81 including scrubbing brushes 82, cleaning solution 83 and a holding tank 84 which, in this embodiment, has two chambers. Scrubbing brushes 82 pick up cleaning solution 83 from the holding tank 84 and vigorously scrub the surface 30 of the substrate 29 cleaning the same of foreign particles. The dual chamber holding tank 84 has more than one chamber, in order to maintain close proximity to the incline path of the endless belt 71. It can be appreciated that the endless belt guide means 68 could be positioned horizontally in this portion of the belt path which would eliminate the necessity of a multiple chamber holding tank. After the substrate has been scrubbed with a cleaning solution 83, a weir rinsing means 88 similar in structure to the weir coating means 15 described previously is utilized for rinsing the cleaning solution 83 from the substrate surface 30 by same arrangement of the weir coating means 15 except that de-ionized water is used in the rinsing weir and preferably turbulent flow across the weir is used. In this portion of the endless belt path, an incline in the path is necessary to move the substrates 29 over the rinsing weir 88.

After the mounted substrate has been rinsed of cleaning solution, the endless belt carries it over and across the blow drying means 89 which blows a stream of pure gaseous fluid, commonly filtered air, across the scrubbed and rinsed substrate surface 30 removing any liquid film remaining on the surface. Next in the cleaning sequence, the scrubbed, rinsed and blown dry substrate is baked by being passed in proximity to an infra-red radiator or heater 90 which evaporates any absorbed fluids still remaining on the substrate surface 30, thereby leaving the surface in a completely uncontaminated state immediately prior to the weir coating operation. It can be appreciated that other cleaning apparatus and methods may be utilized to prepare the surface of the substrate for coating without depreciating from the scope of the novel concepts of the invention.

After the coating 31 has been applied to the substrate surface 30 as described previously, the coating layer 31 is allowed to dry prior to changing the orientation of the coated surface from an inverted position. This prevents contamination from entering the coating while it is still in a fluid state. Additional heating means 91 are utilized to dry at least the surface of the micro-thin coating before the substrate is moved around the gear 73 and placed in an upright position where additional drying means are utilized to completely dry the coating 31. As the substrate is being moved to an upright position, the super-thin coating is not adversely affected by gravity because of its micro-thin nature and remains at a constant thickness during the reorientation movement. If the weir means is used for developing and rinsing of photo plates or semi-conductor wafers, air jets (not shown) may direct filtered air at the substrates at high velocity to dry the coating and blow off excess liquid. Coated substrates may be removed from the apparatus after drying and new uncoated substrates added in a continuous manner as shown generally at 93 and 94, respectively, allowing the apparatus to operate in a continuous manner. Operating the apparatus and method of the invention in a continuous manner may provide for greater economies of scale than the batch producing apparatus. For example, the fixed time and expense required to prepare a clean production room may be allocated over a greater number of finished coated substrates for a given time.

It will be understood that modifications and variations may be effected without departing from the scope of the novel concepts of the present invention, but it is understood that this applicaion is limited only by the scope of the appended claims.

I claim:

1. A method for applying a uniform micro-thin coating of fluid onto the surface of a panel comprising the steps of mounting said panel onto an incline guide means which aligns said panel in an inverted position for preventing the contamination of said panel surface by falling dust particles or the like, and moving said inverted panel in said incline guide means through a position contiguous with the path of a laminar flowing curtain of coating fluid which is moving in a substantially opposite direction to said moving surface across the horizontal top edge of a wall defining a weir, said coating fluid contacting said panel surface and a micro-thin layer of said fluid is transferred to said surface by means of surface tension.

2. The method of claim 1 further including cleaning said panel surface while said panel is mounted in an inverted position before said coating is applied to said surface.

3. The method of claim 2 wherein said cleaning includes the steps of scrubbing said surface with a cleaning solution, rinsing said cleaning solution from said surface, and drying said rinsed and scrubbed surface.

4. The method of claim 3 wherein said rinsing includes moving said panel surface through a position contiguous with and in a direction substantially opposite the path of a traveling curtain of a de-ionized liquid which is moving across the horizontal top edge of a wall defining a weir.

5. The method of claim 3 wherein said drying rinsed and scrubbed surface includes the step of blowing gas across the panel surface to move any foreign matter from said surface.

6. The method of claim 4 wherein said drying further includes the step of evaporating any remaining liquid rinse by moving said surface across an infra-red radiator.

7. The method of claim 1 wherein said drying said coating includes the step of moving said coated surface across an infra-red radiator.

8. A method of applying a uniform micro-thin coating of fluid material onto the surface of a substrate comprising the steps of: mounting said substrate in an inverted position on a guide means for preventing foreign particle contamination of said substrate surface to be coated; moving said substrate in said guide means across scrubbing means containing a cleaning solution for cleaning said substrate surface; rinsing said cleaning solution from said surface by moving said cleaned inverted substrate surface through a position adjacent to and in a direction substantially opposite the path of a curtain of de-ionized rinsing liquid which is moving across the horizontal top edge of a wall defining a weir; drying said cleaned and rinsed inverted substrate surface by blowing gas across said surface to remove foreign matter therefrom, and heating said substrate surface by moving it across an infra-red radiator to evaporate any remaining liquid rinse thereon, then moving said inverted substrate surface in said guide means at an ascending incline angle through a positon contiguous with the path of a laminarly flowing curtain of coating fluid which is moving in a substantially opposite direction to said moving surface across the horizontal top edge of a wall defining a weir, said coating fluid contacting said substrate surface and a micro-thin layer of said fluid is transferred to said surface by means of surface tension, and baking said coating on said surface by moving said surface across an infra-red radiator.

* * * * *